(12) United States Patent
Lee et al.

(10) Patent No.: US 7,929,364 B2
(45) Date of Patent: Apr. 19, 2011

(54) SEMICONDUCTOR MEMORY APPARATUS

(75) Inventors: Jee Eun Lee, Ichon (KR); Mun Phil Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/964,782

(22) Filed: Dec. 27, 2007

(65) Prior Publication Data

US 2008/0253210 A1 Oct. 16, 2008

(30) Foreign Application Priority Data

Apr. 11, 2007 (KR) .......................... 10-2007-0035493

(51) Int. Cl.
*G11C 7/00* (2006.01)
(52) U.S. Cl. ...................................................... 365/203
(58) Field of Classification Search ............. 365/185.25, 365/203
See application file for complete search history.

(56) References Cited

U.S. PATENT DOCUMENTS

| | | | |
|---|---|---|---|
| 5,708,623 A | 1/1998 | Choi | |
| 6,256,254 B1 | 7/2001 | Kwak et al. | |
| 6,359,828 B1 | 3/2002 | La | |
| 6,621,758 B2 | 9/2003 | Cheung et al. | |
| 6,704,240 B2 | 3/2004 | Kang | |
| 7,420,862 B2 * | 9/2008 | Hummler | 365/205 |
| 2003/0103368 A1 * | 6/2003 | Arimoto et al. | 365/63 |
| 2005/0141323 A1 | 6/2005 | Shim | |
| 2005/0213404 A1 * | 9/2005 | Kodama | 365/203 |

FOREIGN PATENT DOCUMENTS

| | | |
|---|---|---|
| JP | 06089592 | 3/1994 |
| JP | 09219091 | 8/1997 |
| JP | 11195294 | 7/1999 |
| JP | 2000215666 | 8/2000 |
| JP | 2001195886 | 7/2001 |
| KR | 1020060038578 A | 5/2006 |

* cited by examiner

*Primary Examiner* — Hoai V Ho
*Assistant Examiner* — Anthan T. Tran
(74) *Attorney, Agent, or Firm* — Baker & McKenzie LLP

(57) ABSTRACT

Disclosed is a semiconductor memory apparatus capable of improving precharge performance. The semiconductor memory apparatus includes a plurality of memory banks, data input/output lines commonly connected to the memory banks, and a plurality of precharge circuit units connected to the data input/output lines and aligned in an extension direction of the data input/output lines while being spaced apart from each other by a predetermined distance.

20 Claims, 7 Drawing Sheets

SEMICONDUCTOR MEMORY APPARATUS

CROSS-REFERENCES TO RELATED APPLICATION

The present application claims priority under 35 U.S.C. 119(a) to Korean application number 10-2007-35493, filed on Apr. 11, 2007, in the Korean Patent Office, which is incorporated by reference in its entirety as if set forth in full.

BACKGROUND

1. Technical Field

The embodiments described herein relate to semiconductor circuit technology and, more particularly, to a semiconductor memory apparatus capable of improving precharge performance.

2. Related Art

As shown in FIG. 1, a conventional semiconductor memory apparatus includes a plurality of memory banks BANK 0 to BANK 15, a plurality of column decoders 10, a plurality of write drivers (WDRV) 20, and a plurality of IO sense amplifiers (IOSA) 30. The decoders 10 are respectively disposed in one-to-one correspondence with the memory banks BANK 0 to BANK 15. Each memory bank group includes one write driver 20 and one IO sense amplifier 30.

Still referring to FIG. 1, the semiconductor memory apparatus can further comprise a plurality of memory bank groups of which memory bank group 101 is shown as a representative example. A memory bank group has a plurality of memory banks (for instance, BANK 0, BANK 1, BANK 8 and BANK 9), which are aligned in the same vertical line. The write driver 20 records data, received from outside the circuit, in the presently activated memory bank of a corresponding memory bank group through a data input/output line, or local IO line, (nor shown). When data is to be read out, the IO sense amplifier 30 detects data read out of a memory bank in an associated memory bank group, via the local IO line, amplifies and outputs the data.

As can be seen, the write driver 20 has a precharge circuit unit 40. FIG. 2 is a diagram illustrating the write drive 20 for memory bank group 101 in more detail. Specifically, the connection structure between the precharge circuit unit 40 and the local IO line will be described with reference to FIG. 2. Elements, which have no direct connection to the precharge circuit unit 40, are omitted from FIG. 2.

As shown in FIG. 2, the precharge circuit unit 40 is commonly connected to the memory banks BANK 0, BANK 1, BANK 8 and BANK 9 through the local IO lines LIO and LIOB. The precharge circuit unit 40 can precharge the local IO lines LIO and LIOB to a predetermined voltage level whenever data input/output operations are not being performed through the local IO lines LIO and LIOB.

FIG. 3 is a timing diagram illustrating the precharge operation of the conventional semiconductor memory apparatus having the above structure. Generally, The precharge operation must be performed after a current write or read operation is completed and before the next write or read operation is to occur.

The data input/output operation is performed through the local IO lines LIO and LIOB while a column selection signal Yi is being activated according to a write or read command. If the column selection signal Yi is activated, the precharge signal LIOPCG is not activated. In contrast, if the column selection signal Yi is not activated, the precharge signal LIOPCG is activated. As the precharge signal LIOPCG is activated, the precharge circuit unit 40 shown in FIG. 2 precharges the local IO lines LIO and LIOB.

Referring again to FIG. 2, in a conventional semiconductor memory apparatus, a plurality of memory banks are vertically aligned and the local IO lines LIO and LIOB are connected to the memory banks. As the length of the local IO lines LIO and LIOB increases, a line load also increases due to the inherent resistance and capacitance of the lines. If the line load is increased, the precharge time is also increased as represented by A, A', B and B' in FIG. 3.

If the precharge time increases, then certain operational characteristics of the conventional semiconductor memory apparatus, such as tCCD (CAS to CAS command delay) and tWRT (Internal WRITE to READ command delay) shown in FIG. 3, can deteriorate, lowering the operational speed of the semiconductor memory apparatus. If the operational speed of the semiconductor memory apparatus is excessively lowered, the operational characteristics of the semiconductor memory apparatus may deviate from the standard thereof.

SUMMARY

A semiconductor memory apparatus capable of rapidly and stably performing a precharge operation is described herein.

According to one aspect, there is provided a semiconductor memory apparatus comprising a plurality of memory banks, data input/output lines commonly connected to the memory banks, and a plurality of precharge circuit units connected to the data input/output lines and aligned in an extension direction of the data input/output lines, while being spaced apart from each other by a predetermined distance.

According to another aspect, there is provided a semiconductor memory apparatus comprising data input/output lines commonly connected to a plurality of memory banks, a plurality of precharge circuit units connected to the data input/output lines to precharge the data input/output lines according to a precharge signal, and a precharge controller that allows input precharge signal to pass through a plurality of paths, which are different from each other, to supply the precharge signal to the plurality of precharge circuit units.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
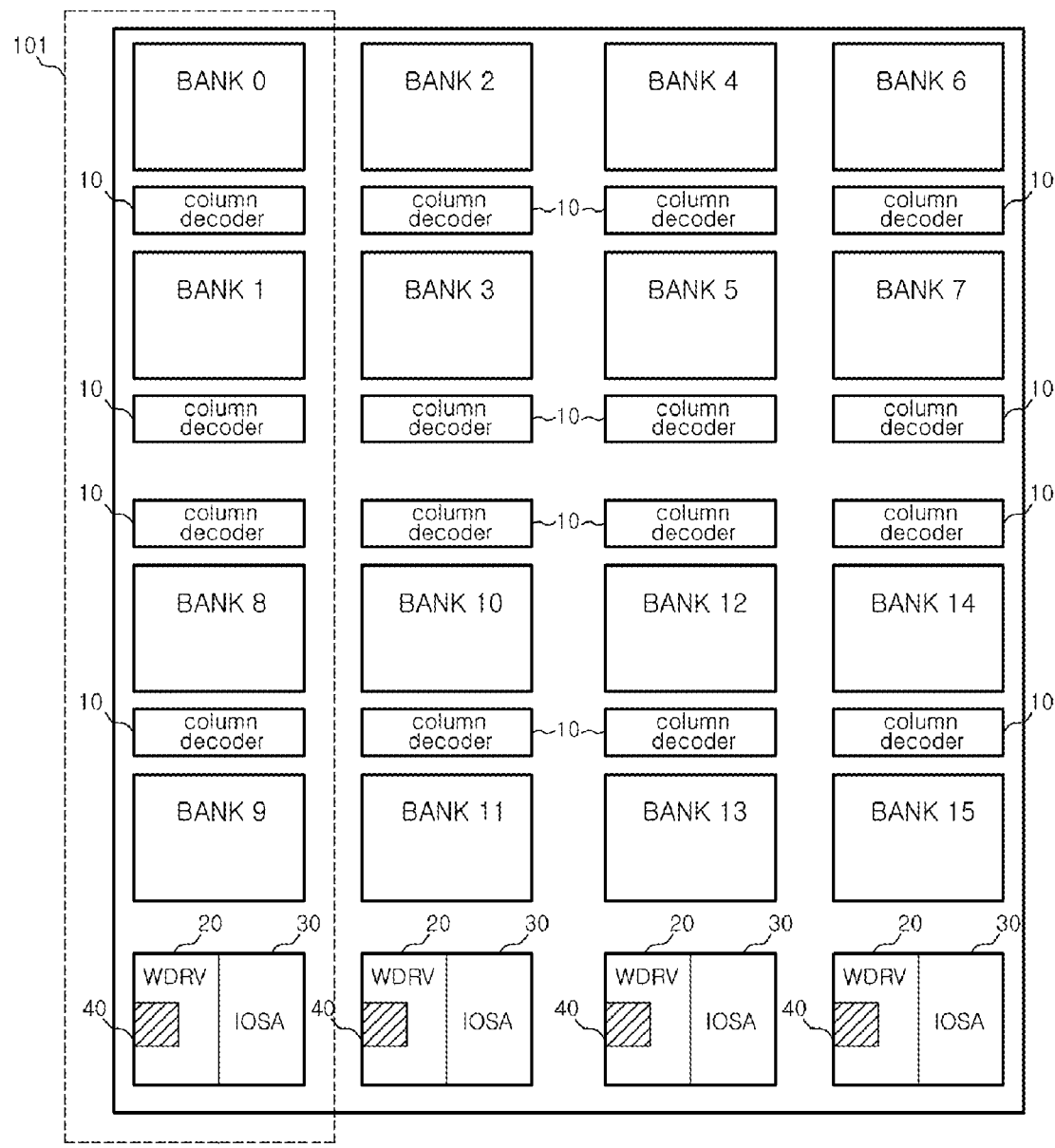
FIG. 1 is a block diagram showing the structure of a conventional semiconductor memory apparatus.
Figure 2:
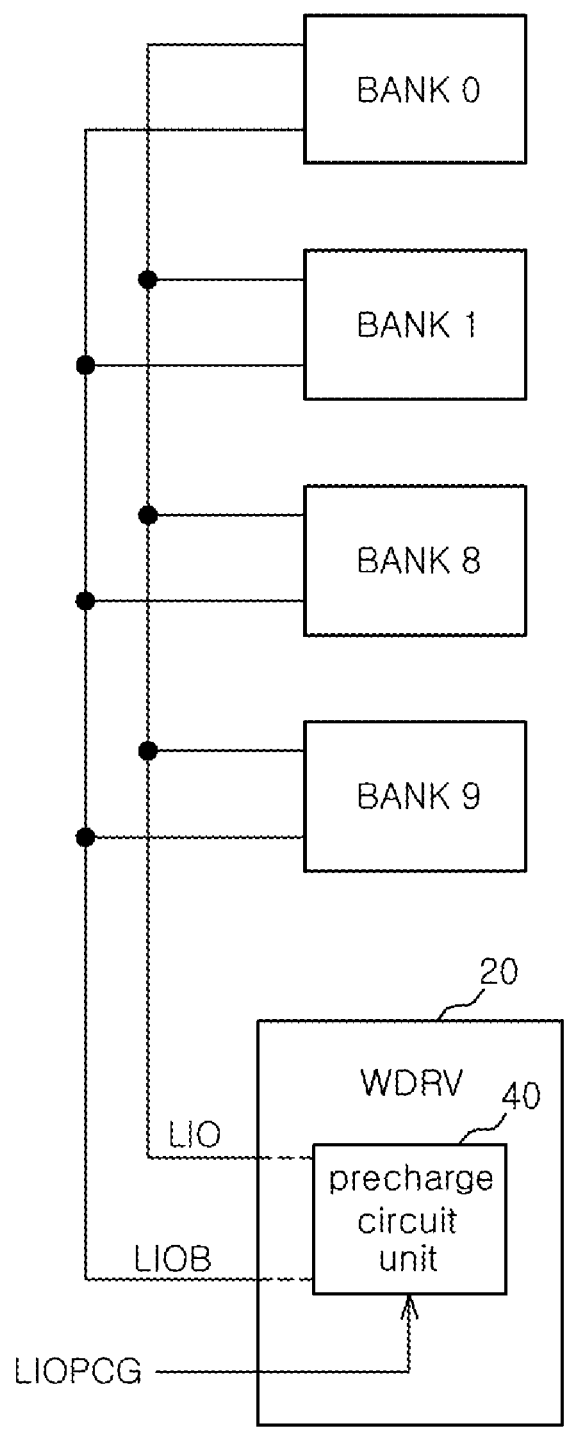
FIG. 2 is a block diagram showing the connection structure of local IO lines included in the apparatus illustrated in FIG. 1.
Figure 3:
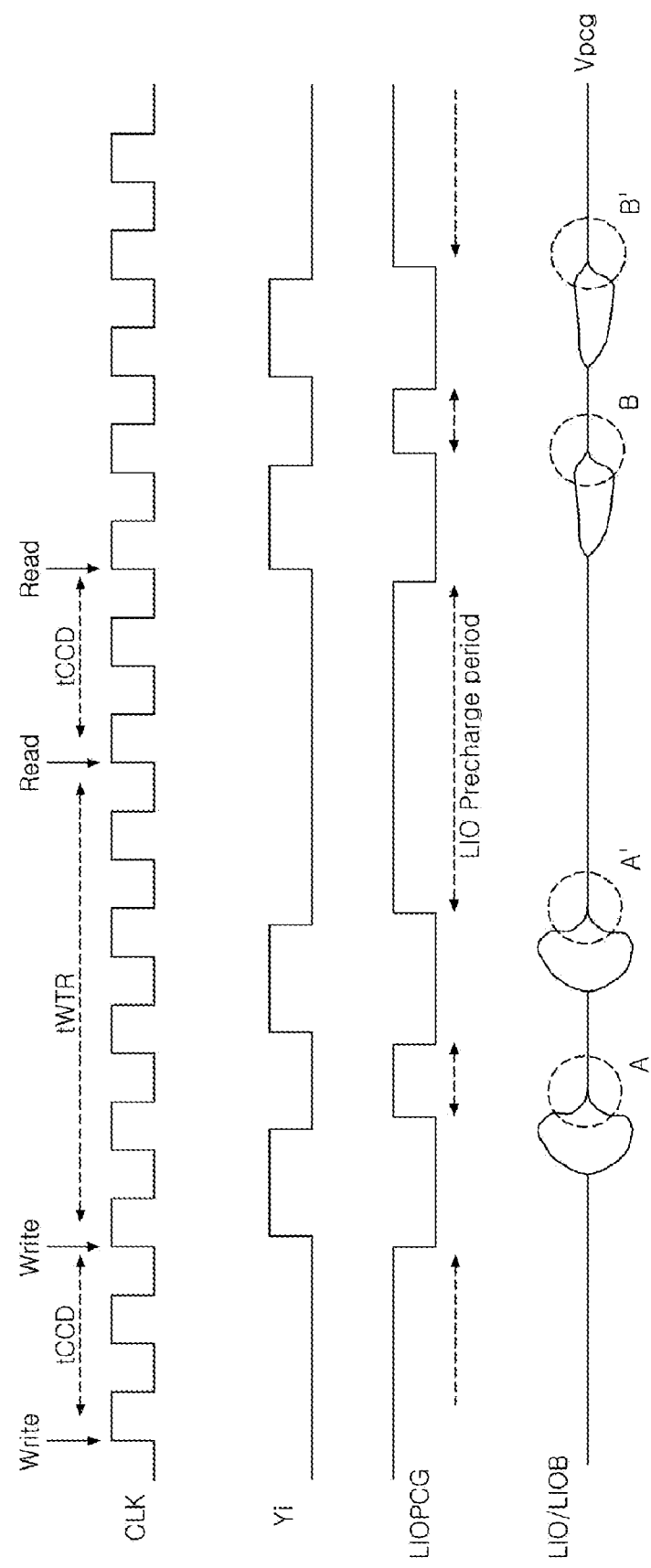
FIG. 3 is a timing diagram illustrating a precharge operation for the conventional semiconductor memory apparatus of FIG. 1.
Figure 4:
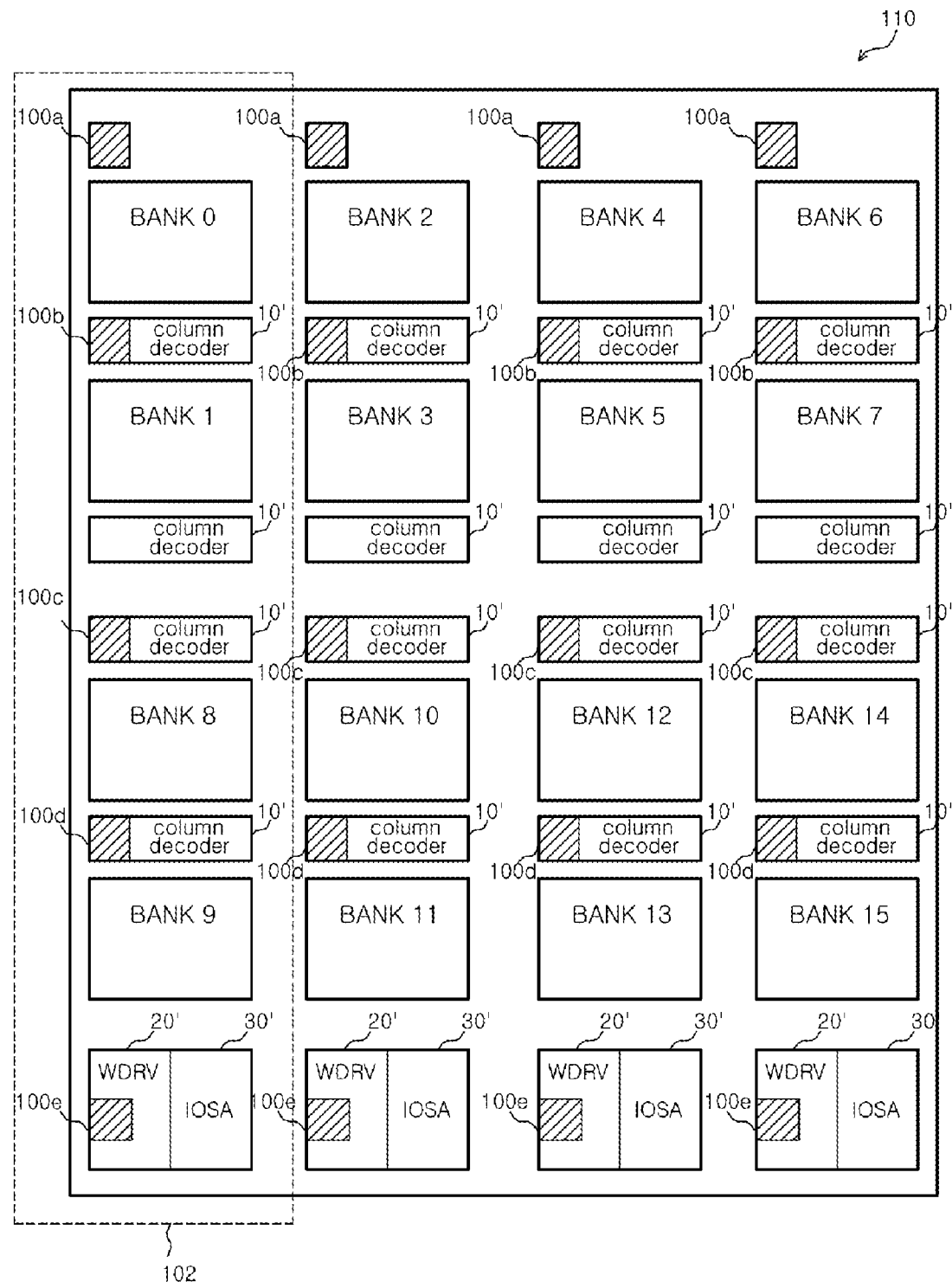
FIG. 4 is a block diagram showing a structure of a semiconductor memory apparatus according to one embodiment.

FIG. 4 is a diagram illustrating an example semiconductor memory apparatus 110 configured in accordance with one embodiment. As shown in FIG. 4, the semiconductor memory apparatus 110 can include a plurality of memory banks BANK 0 to BANK 15, a plurality of column decoders 10', a plurality of write drivers (WDRV) 20', a plurality of IO sense amplifiers (IOSA) 30', and a plurality of precharge circuit units 100a to 100e.

The decoders 10' are respectively disposed in a one-to-one correspondence with the memory banks BANK 0 to BANK 15. Each memory bank group, such as group 102, can include one write driver 20' and one IO sense amplifier 30'. As shown in FIG. 4, each memory bank group, of which the memory bank group 102 is a representative example, can comprise a plurality of memory banks (for instance, BANK 0, BANK 1, BANK 8 and BANK 9), which are aligned in the same line.

The write driver 20' can be configured to record data received from outside the apparatus 110 in a presently activated memory bank, of the associated group, e.g., group 102, through a data input/output line, or local IO line (not shown). When data is to be read out of a memory bank, the associated IO sense amplifier 30' can be configured to detect the data, which is output from the memory bank, amplify the data, and output the data to peripheral circuits.

Referring to the memory bank group 102 as an example, it can be see that at least one of the precharge circuit units 100a to 100e can be formed adjacent to at least one of the memory banks BANK 0, BANK 1, BANK 8 and BANK 9, respectively. The precharge performance, that is, the operational speed and stability of the apparatus 110, can be improved during fabrication by selectively forming the precharge circuit units 100a, 100c and 100e or the precharge circuit units 100a and 100e in manner that will not increase the line load and therefore prevent degradation of the precharge performance.

This can be achieved in part by aligning the precharging units in an extension direction, e.g., vertically or from the top of the page toward the bottom in this example, of the data input/output lines, and spacing them apart from each other by a predetermined distance. As can be seen, the memory banks are also aligned in the extension direction of the data input/output lines. Moreover, the precharge circuit units can be formed adjacent to the memory banks.

Hereinafter, the connection structure between the precharge circuit units 100a to 100e in group 102 and the local IO lines LIO and LIOB will be described in detail with reference to FIG. 5. Elements, which have no direct connection to the precharge circuit units 100a to 100e, are omitted from FIG. 5.

Figure 5:
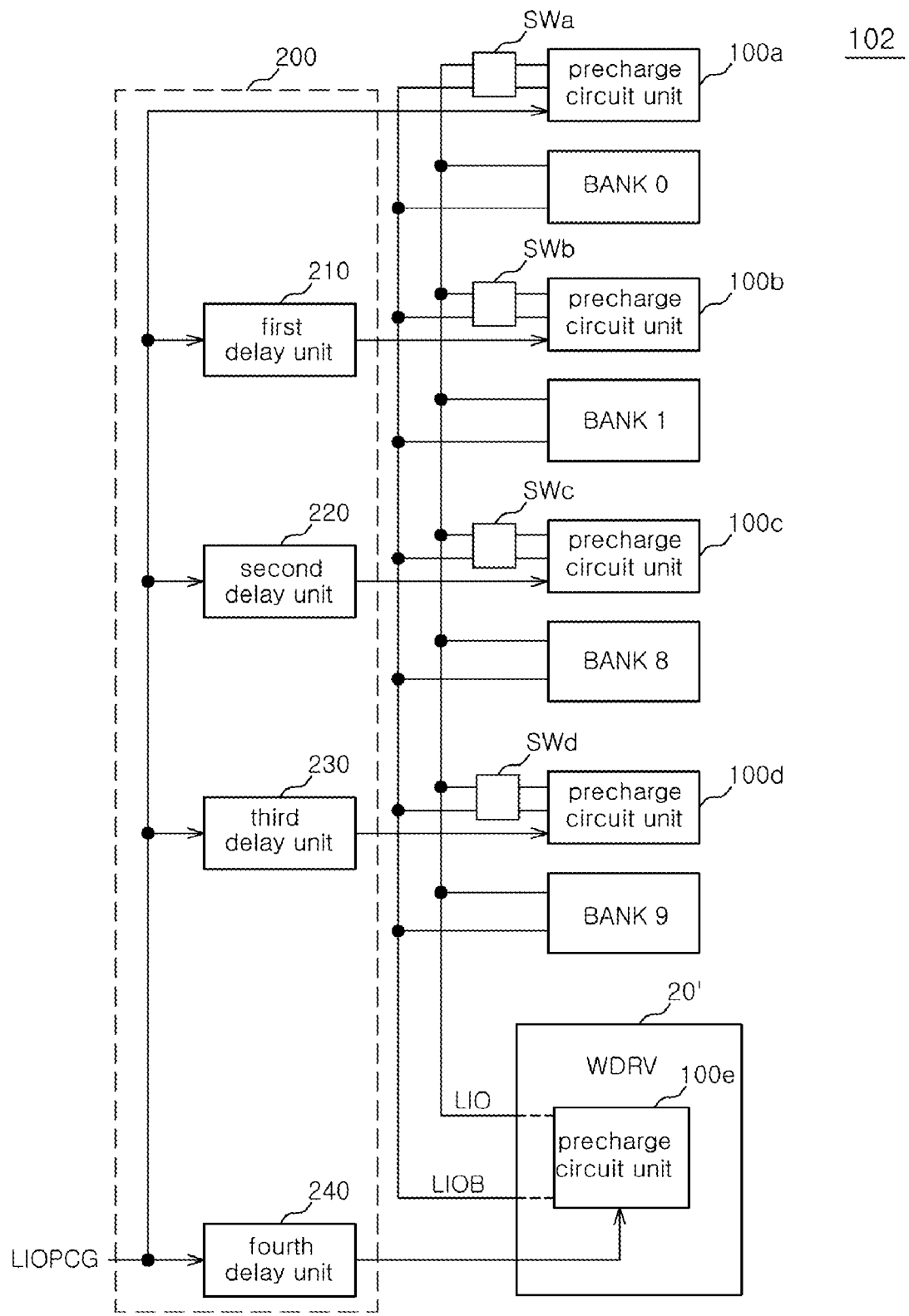
FIG. 5 is a block diagram showing a connection structure of local IO lines that can be included in the apparatus illustrated in FIG. 4.

As shown in FIG. 5, the semiconductor memory apparatus 110 can include a plurality of memory banks BANK 0, BANK 1, BANK 8 and BANK 9, local IO lines LIO and LIOB, a plurality of precharge circuit units 100a to 100e, a plurality of switching units SWa to SWd, and a precharge controller 200. As further shown, the local IO lines LIO and LIOB can be coupled between the memory banks BANK 0, BANK 1, BANK 8 and BANK 9 and the write driver 20'. Specifically the precharge circuit units 100a to 100e can be connected to the local IO lines LIO and LIOB through the switching units SWa to SWd.

The precharge circuit units 100a to 100e can be configured to precharge the local IO lines LIO and LIOB according to the precharge signal LIOPCG.

The precharge circuit units 100a to 100e can be selectively connected to the local IO lines LIO and LIOB by using the switching units SWa to SWd, which can include fuses or configurable metal devices. In other embodiments, the precharge circuit units 100a to 100e can be selectively connected to the local IO lines LIO and LIOB through a metal layer revision scheme, instead of using the switching units SWa to SWd.

The precharge controller 200 can be configured to allow the precharge signal LIOPCG to pass through a plurality of paths, which are different from each other, such that the precharge signal LIOPCG can be simultaneously, or almost simultaneously provided to the precharge circuit units 100a to 100e. As illustrated, the precharge controller 200 can include first to fourth delay units 210 to 240 configured to receive the precharge signal LIOPCG and provide the precharge signal LIOPCG to the precharge circuit units 100a to 100e after delaying the precharge signal LIOPCG by a predetermined delay time.

The delay time can be preset for each of the first to fourth delay units 210 to 240 in such a way that the delay time is inversely proportional to the length of the signal line receiving the precharge signal LIOPCG. As mentioned above, the line load is increased proportionally to the length of the signal line receiving the precharge signal LIOPCG. Accordingly, the shortest delay time can be set to the first delay unit 210, which requires the longest signal line for receiving the precharge signal LIOPCG and therefore has the largest line load. Conversely, the longest delay time can be set to the fourth delay unit 240, which requires the shortest signal line and therefore has the smallest line load. Due to the delay operation of the first to fourth delay units 210 to 240, the precharge signal LIOPCG can be input into the precharge circuit units 100a to 100e at approximately the same time.

Figure 6A:
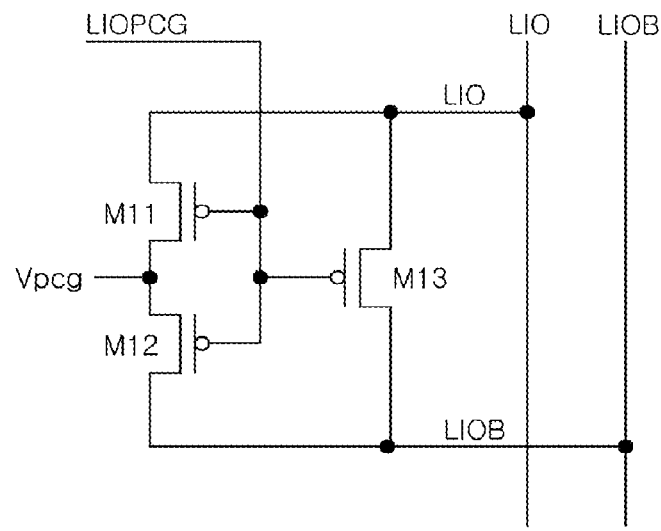
FIGS. 6A and 6b are circuit diagrams showing precharge circuit units that can be included in the apparatus illustrated in FIG. 1.

FIG. 6A is a diagram illustrating precharging unit 100a in more detail. As shown in FIG. 6A, the precharge circuit unit 100a can include first to third transistors M11 to M13. The first transistor M11 has a source receiving the precharge voltage Vpcg and a drain connected to the local IO line LIO. The second transistor M12 has a source receiving the precharge voltage Vpcg and a drain connected to the local IO line LIOB. The third transistor M13 has a source commonly connected to the local IO line LIO and the drain of the first transistor M11 and a drain commonly connected to the local IO line LIOB and the drain of the second transistor M12. The precharge signal LIOPCG can be commonly applied to gates of the first to third transistors M11 to M13.

Figure 6B:
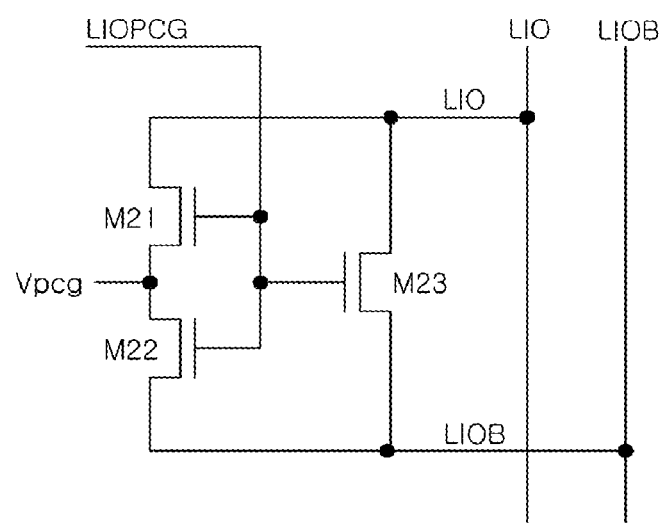

In the example of FIG. 6A, PMOS transistors are used as the first to third transistors M11 to M13. Alternatively, as shown in FIG. 6B, the precharge circuit unit 100a can be implemented using NMOS transistors.

It will be understood that the precharge circuit units 100b to 100e can comprise the same circuit structure as that of the precharge circuit unit 100a. Further, although the precharge circuit unit 100e is illustrated as included in the write driver 20', this can be changed according to the requirements of a specific implementation, such that precharge unit 100e can be external to write driver 20'.

In the embodiment of FIG. 4, the column decoders 10' are disposed in a one-to-one correspondence with the memory banks. However, according to another embodiment as shown in FIG. 7, two memory banks (for instance, BANK 0 and BANK 1) can share one column decoder 300.

Figure 7:
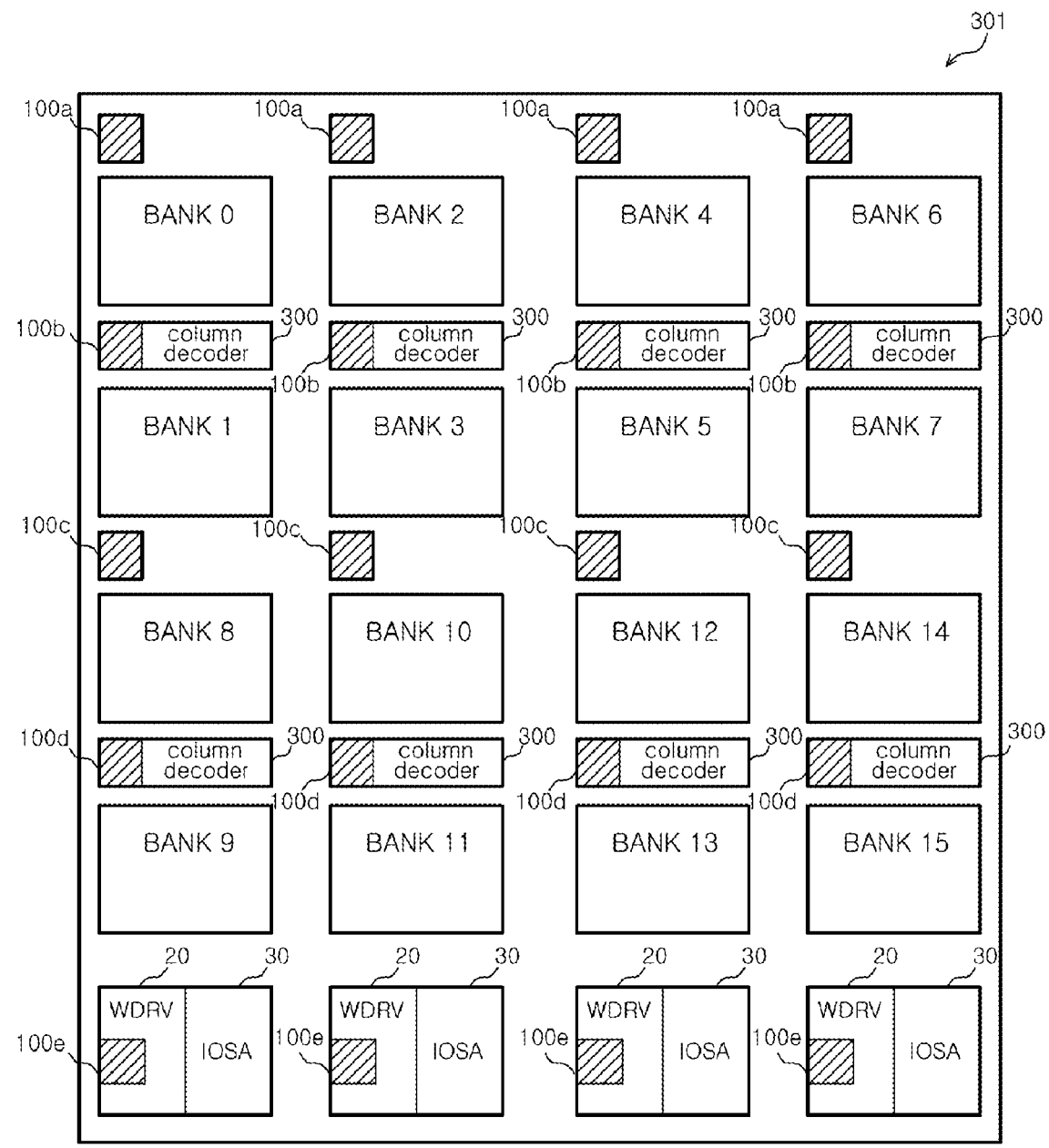
FIG. 7 is a block diagram showing a structure of a semiconductor memory apparatus according to another embodiment.

In the semiconductor memory apparatus 301 having the structure shown in FIG. 7, the position of the precharge circuit units 100a to 100e can be identical to that of the precharge circuit units 100a to 100e shown in FIG. 4.

The precharge circuit units 100a to 100e must rapidly and stably precharge the local IO lines LIO and LIOB, and the position of the precharge circuit units 100a to 100e must be determined to achieve the above function.

In the semiconductor memory apparatus having the structure shown in FIG. 7 in which two memory banks (for instance, BANK 0 and BANK 1) share one column decoder 300, the alignment of the memory banks BANK 0 to BANK 15 and the local IO lines LIO and LIOB can be identical to that of the memory banks BANK 0 to BANK 15 and the local IO lines LIO and LIOB shown in FIG. 4. Since the alignment of the memory banks BANK 0 to BANK 15 and the local IO lines LIO and LIOB shown in FIG. 7 can be identical to that of the memory banks BANK 0 to BANK 15 and the local IO lines LIO and LIOB shown in FIG. 4, it is possible to form the precharge circuit units 100a to 100e identically to the precharge circuit units 100a to 100e shown in FIG. 4.

In addition, the precharge circuit units 100b to 100e shown in FIG. 7 can be selectively formed in the same manner as the precharge circuit units 100a to 100e shown in FIG. 4.

As described above, the precharge operation can be rapidly and stably performed regardless of the length of the data input/output line and the line load, so that the operational speed of the semiconductor memory apparatus can be improved and the semiconductor memory apparatus can be stably operated.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory apparatus, comprising:
a plurality of memory banks;
a write driver configured for accessing the plurality of memory banks;
data input/output lines commonly coupled between the memory banks and the write driver;
a plurality of precharge circuit units coupled to the data input/output lines and aligned in an extension direction of the data input/output lines, the plurality of precharge circuit units being spaced apart from each other by a predetermined distance; and
a plurality of switching units configured to couple between the pair of the data input/output lines and respective precharge circuit units, wherein at least one of the switching units is selectively operated,
wherein the plurality of switching units are configured to select at least one of the precharge circuit units irrespective of which of the plurality of memory banks is accessed by the write driver.

2. The semiconductor memory apparatus of claim 1, wherein the memory banks are also aligned in the extension direction of the data input/output lines.

3. The semiconductor memory apparatus of claim 1, wherein the precharge circuit units are formed adjacent to the memory banks.

4. The semiconductor memory apparatus of claim 1, further comprising a precharge controller coupled with the plurality of precharge units, the precharge controller configured to supply a precharge signal to each of the plurality of precharge circuit units.

5. The semiconductor memory apparatus of claim 1, wherein the data input/output lines comprise:
a first data input/output line; and
a second data input/output line configured to transmit data having a phase opposite to a phase of data transmitted through the first data input/output line.

6. The semiconductor memory apparatus of claim 4, wherein the precharge controller is configured to supply the precharge signal to each of the plurality of precharge circuit units at substantially the same time.

7. The semiconductor memory apparatus of claim 4, wherein the precharge controller includes a plurality of delay units, each of the plurality of delay units configured to receive the precharge signal and supply the precharge signal to one of the plurality of precharge circuit units after delaying the precharge signal by a predetermined delay time.

8. The semiconductor memory apparatus of claim 7, wherein delay times of each of the delay units are different from each other.

9. The semiconductor memory apparatus of claim 7, wherein delay times of each of the delay units are inversely proportional to a length of a signal line through which the precharge signal are supplied to the delay units.

10. A semiconductor memory apparatus comprising:
a plurality of memory banks;
a pair of data input/output lines commonly coupled to the plurality of memory banks;
a write driver configured for accessing the plurality of memory banks;
a plurality of precharge circuit units coupled to the data input/output lines, the plurality of precharge circuit units configured to precharge the data input/output lines according to a precharge signal;
a precharge controller coupled with the plurality of precharge circuit units, the precharge controller configured to supply the precharge signal to each of the plurality of precharge circuit units at substantially the same time; and
a plurality of switching units configured to couple between respective precharge circuit units and the pair of the data input/output lines,
wherein the plurality of switching units are configured to select at least one of the precharge circuit units irrespective of which of the plurality of memory banks is accessed by the write driver.

11. The semiconductor memory apparatus of claim 10, wherein the precharge controller is further configured to allow the precharge signal to pass through a plurality of paths, which are different from each other, to supply the precharge signal to each of the plurality of precharge circuit units at substantially the same time.

12. The semiconductor memory apparatus of claim 10, wherein the memory banks are aligned in an extension direction of the data input/output lines.

13. The semiconductor memory apparatus of claim 10, wherein the data input/output lines are coupled to the write driver.

14. The semiconductor memory apparatus of claim 10, wherein each of the plurality of precharge circuit units are formed adjacent to at least one of the memory banks.

15. The semiconductor memory apparatus of claim 10, wherein the switching unit includes a fuse or a configurable metal device.

16. The semiconductor memory apparatus of claim 10, wherein the data input/output lines comprise:

a first data input/output line; and a second data input/output line configured to transmit data having a phase opposite to a phase of data transmitted through the first data input/output line.

17. The semiconductor memory apparatus of claim 16, wherein each of the plurality of precharge circuit units comprise at least one switching device connected between the first data input/output line and the second data input/output line in order to apply a voltage having a predetermined level to the first and second data input/output lines according to a precharge signal.

18. The semiconductor memory apparatus of claim 10, wherein the precharge controller includes a plurality of delay units, each of the plurality of delay units configured to receive the precharge signal and supply the precharge signal to the precharge circuit units after delaying the precharge signal by a predetermined delay time.

19. The semiconductor memory apparatus of claim 18, wherein delay times of each of the plurality of delay units are different from each other.

20. The semiconductor memory apparatus of claim 18, wherein the delay times of each of the plurality of delay units are inversely proportional to a length of a signal line through which the precharge signal are supplied to the delay units.

* * * * *